US012713978B2

(12) United States Patent
Dzyubenko et al.

(10) Patent No.: US 12,713,978 B2
(45) Date of Patent: Aug. 18, 2026

(54) LIGHT-EMITTING DIODE DEVICES WITH SUPPORT ELEMENTS FOR IMPROVED NEAR-FIELD AND FAR-FIELD EMISSIONS

(71) Applicant: CreeLED, Inc., Durham, NC (US)

(72) Inventors: Boris Dzyubenko, Morrisville, NC (US); Florin A. Tudorica, Chapel Hill, NC (US); Christopher P. Hussell, Raleigh, NC (US); Walter Weare, Pittsboro, NC (US); Iliya Todorov, Morrisville, NC (US); Robert David Schmidt, Wake Forest, NC (US)

(73) Assignee: CreeLED, Inc., Durham, NC (US)

( * ) Notice: Subject to any disclaimer, the term of this patent is extended or adjusted under 35 U.S.C. 154(b) by 617 days.

(21) Appl. No.: 18/051,136

(22) Filed: Oct. 31, 2022

(65) Prior Publication Data

US 2024/0145439 A1 May 2, 2024

(51) Int. Cl.
*H01L 23/498* (2006.01)
*G11C 5/06* (2006.01)
(Continued)

(52) U.S. Cl.
CPC .......... *H10W 90/00* (2026.01); *H10H 20/855* (2025.01); *H10H 20/856* (2025.01); *H10H 20/857* (2025.01); *H10H 20/882* (2025.01)

(58) Field of Classification Search
CPC .. H10H 20/855; H10H 20/856; H10H 20/882; H10H 29/855; H10H 29/8552;
(Continued)

(56) References Cited

U.S. PATENT DOCUMENTS 7,350,942 B2 4/2008 Chen et al.
8,415,695 B2 * 4/2013 Lenk ........................ F21V 5/00 257/98

(Continued)

FOREIGN PATENT DOCUMENTS

JP H0720793 A 1/1995
JP 2020167364 A 10/2020

(Continued)

OTHER PUBLICATIONS

International Search Report and Written Opinion for International Patent Application No. PCT/US2023/077362, mailed Mar. 21, 2024, 27 pages.

(Continued)

*Primary Examiner* — Wael M Fahmy
*Assistant Examiner* — Aneesa Riaz Baig
(74) *Attorney, Agent, or Firm* — Withrow & Terranova, P.L.L.C.

(57) ABSTRACT

Light-emitting devices including solid-state light-emitting devices, light-emitting diode (LED) devices, and LED packages with support elements for improved near-field and far-field emissions are disclosed. LED chips may be mounted to support elements in a manner that directs light through the support elements in desired emission directions. Support elements include optical structures that spread and mix light laterally within the support element. Optical structures include interior mixing chambers bounded by light-altering layers, such as light-diffusing layers or light-reflective layers, that effectively increase internal reflections within the mixing chambers for lateral spreading of light. Support elements as described may be well suited for low profile LED devices where device heights are less than or equal to device widths.

26 Claims, 5 Drawing Sheets

(51) Int. Cl.

| | |
|---|---|
| ***H01L 21/768*** | (2006.01) |
| ***H01L 23/00*** | (2006.01) |
| ***H01L 23/495*** | (2006.01) |
| ***H10B 51/10*** | (2023.01) |
| ***H10B 51/20*** | (2023.01) |
| ***H10H 20/80*** | (2025.01) |
| ***H10H 20/852*** | (2025.01) |
| ***H10H 20/855*** | (2025.01) |
| ***H10H 20/856*** | (2025.01) |
| ***H10H 20/857*** | (2025.01) |
| ***H10W 90/00*** | (2026.01) |

(58) Field of Classification Search

CPC ...... H10H 29/856; H10H 20/00; H10H 20/80; H10H 20/85; H10H 29/00; H10H 29/14; H10H 29/80; H10H 29/85; H10H 20/841; G02F 1/133603–133606

See application file for complete search history.

(56) References Cited

U.S. PATENT DOCUMENTS

| | | | | |
|---|---|---|---|---|
| 10,453,827 | B1 | 10/2019 | Hussell et al. | |
| 2007/0147073 | A1* | 6/2007 | Sakai | G02B 6/0021 362/607 |
| 2010/0110675 | A1* | 5/2010 | Van Herpen | B32B 17/10706 349/193 |
| 2012/0134134 | A1* | 5/2012 | Bechtel | H01L 25/0753 362/84 |
| 2013/0146936 | A1 | 6/2013 | Tsai et al. | |
| 2014/0071683 | A1* | 3/2014 | Hamada | G03B 33/12 252/301.6 F |
| 2014/0209930 | A1* | 7/2014 | Weng | H10H 20/857 438/26 |
| 2016/0027977 | A1 | 1/2016 | Seo et al. | |
| 2016/0163938 | A1* | 6/2016 | Yu | H10H 20/841 438/31 |
| 2016/0293811 | A1 | 10/2016 | Hussell et al. | |
| 2016/0315070 | A1* | 10/2016 | Schricker | H10H 20/855 |
| 2017/0328525 | A1* | 11/2017 | Herrmann | H01L 25/0753 |
| 2018/0076368 | A1 | 3/2018 | Hussell | |
| 2018/0156421 | A1* | 6/2018 | Li | F21V 5/043 |
| 2019/0088840 | A1 | 3/2019 | Diana et al. | |
| 2019/0294005 | A1* | 9/2019 | Imada | G02F 1/133611 |
| 2019/0305177 | A1* | 10/2019 | Takamatsu | H10H 20/856 |
| 2019/0371974 | A1* | 12/2019 | Hussell | H10H 20/852 |
| 2019/0390839 | A1* | 12/2019 | Sugiyama | G06F 3/041 |
| 2020/0371398 | A1* | 11/2020 | Imada | G02F 1/133603 |
| 2021/0135057 | A1* | 5/2021 | Ye | H10H 20/8264 |
| 2021/0200028 | A1 | 7/2021 | Zhang et al. | |
| 2022/0077362 | A1* | 3/2022 | Nagel | H10H 20/851 |
| 2022/0155512 | A1* | 5/2022 | Choi | B60Q 3/78 |
| 2022/0171234 | A1* | 6/2022 | Usukura | G02F 1/133536 |
| 2022/0246807 | A1* | 8/2022 | Chae | H10H 20/855 |
| 2023/0178697 | A1* | 6/2023 | Chu | H10H 20/853 |
| 2023/0231082 | A1* | 7/2023 | Sakai | H10H 20/8506 |
| 2023/0358384 | A1* | 11/2023 | Choi | H10H 20/857 |
| 2023/0378403 | A1* | 11/2023 | Arihara | B32B 27/36 |
| 2023/0420609 | A1* | 12/2023 | Yu | H10H 20/84 |
| 2024/0145439 | A1* | 5/2024 | Dzyubenko | H10H 20/857 |
| 2024/0421274 | A1* | 12/2024 | Sakai | H10H 20/856 |

FOREIGN PATENT DOCUMENTS

| | | | |
|---|---|---|---|
| JP | 2022056885 | A | 4/2022 |
| KR | 20210115237 | A | 9/2021 |
| TW | 201431041 | A | 8/2014 |
| TW | 201616687 | A | 5/2016 |

OTHER PUBLICATIONS

Preliminary Examination Report for Taiwanese Patent Application No. 112140885, mailed Sep. 2, 2024, 24 pages.

Invitation to Pay Additional Fees and Partial Search for International Patent Application No. PCT/US2023/077362, mailed Jan. 31, 2024, 23 pages.

Maiorano, et al., “Very Long Operational Lifetime at High Initial Luminance of Deep Red Phosphorescent Organic Light-Emitting Diodes with Double Emission Layers,” IEEE Photonics Technology Letters, vol. 20, Issue 24, Dec. 15, 2008, pp. 2105-2107.

Office Action for Canadian Patent Application No. 3271798, mailed Apr. 1, 2026, 4 pages.

Search Report for Japanese Patent Application No. 2025-525072, mailed May 29, 2026, 40 pages.

Notice of Reasons for Refusal for Japanese Patent Application No. 2025-525072, mailed Jun. 22, 2026, 6 pages.

* cited by examiner

LIGHT-EMITTING DIODE DEVICES WITH SUPPORT ELEMENTS FOR IMPROVED NEAR-FIELD AND FAR-FIELD EMISSIONS

FIELD OF THE DISCLOSURE

The present disclosure relates to light-emitting devices including solid-state light-emitting devices, light-emitting diodes, and light-emitting diode packages with support elements for improved near-field and far-field emissions.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications such as video screens and are being routinely utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are emitted in all directions.

LED packages have been developed that provide mechanical support, electrical connections, encapsulation, and reflective surfaces for directing light emissions for LED emitters in a desired direction. Light emissions that exit surfaces of LED emitters may interact with various elements or surfaces of corresponding LED packages before escaping. As LED package structures continue to evolve for modern applications, challenges remain in producing high quality light with desired emission characteristics, particularly as overall LED package sizes continue to be miniaturized.

The art continues to seek improved LEDs and solid-state lighting devices having desirable illumination characteristics capable of overcoming challenges associated with conventional lighting devices.

SUMMARY

The present disclosure relates to light-emitting devices including solid-state light-emitting devices, light-emitting diode (LED) devices, and LED packages with support elements for improved near-field and far-field emissions. LED chips may be mounted to support elements in a manner that directs light through the support elements in desired emission directions. Support elements include optical structures that spread and mix light laterally within the support element. Optical structures include interior mixing chambers bounded by light-altering layers, such as light-diffusing layers or light-reflective layers, that effectively increase internal reflections within the mixing chambers for lateral spreading of light, thereby increasing path lengths light will propagate within devices before being released. Accordingly, effective device thicknesses related to path lengths of light may be increased without substantial increases to actual device thicknesses. Support elements as described may be well suited for low profile LED devices where device heights are less than or equal to device widths.

In one aspect, an LED device comprises: one or more LED chips; and a support element on which the one or more LED chips are mounted, wherein the support element is configured to be light-transmissive to wavelengths of light generated by the one or more LED chips, and the support element comprises an interior mixing chamber that spreads light laterally within the support element. In certain embodiments, the interior mixing chamber is formed by a light-transparent layer that is between a first light-diffusing layer and a second light-diffusing layer. In certain embodiments, at least one of the first light-diffusing layer and the second light-diffusing layer comprises a multiple layer structure. In certain embodiments, the light-transparent layer comprises glass, and the first light-diffusing layer and the second light-diffusing layer comprise glass with light-diffusing particles. In certain embodiments, the light-diffusing particles comprise particles with a different refractive index than the glass. In certain embodiments, the light-transparent layer, the first light-diffusing layer, and the second light-diffusing layer each have a thickness that is in a range from 20 microns (μm) to 200 μm. In certain embodiments, the support element further comprises a light-absorbing layer on the second light-diffusing layer. In certain embodiments, the light-absorbing layer comprises light-diffusing particles dispersed within a light-transparent material.

In certain embodiments, the one or more LED chips are mounted to a mounting face of the support element, and an opposing face of the support element forms a primary emission face of the LED device. The LED device may further comprise contact pads on a side of the one or more LED chips that is opposite the support element, wherein a height of the LED device as measured from the contact pads to the primary emission face is less than or equal to a width of the support element as measured between opposing peripheral edges of the support element. In certain embodiments, the height and the width are in a range from 200 microns (μm) to 1000 μm. In certain embodiments, the interior mixing chamber is formed by a light-transparent layer that is between a first light-reflective layer and a second light-reflective layer. In certain embodiments, the first light-reflective layer and the second light-reflective layer each have a thickness that is less than or equal to 0.05 microns (μm). In certain embodiments, the one or more LED chips comprise a first LED chip configured to provide a first peak wavelength in a range from 430 nanometers (nm) to 480 nm, a second LED chip configured to provide a second peak wavelength in a range from 500 nm to 570 nm, and a third LED chip configured to provide a third peak wavelength in a range from 600 nm to 700 nm. In certain embodiments, the interior mixing chamber is one of a plurality of interior mixing chambers that are stacked within the support element.

In another aspect, an LED device comprises: one or more LED chips; and a support element on which the one or more LED chips are mounted, wherein the support element is configured to be light-transmissive to wavelengths of light generated by the one or more LED chips, the support element comprising a light-transparent layer that is between a first light-altering layer and a second light-altering layer. In certain embodiments, the first light-altering layer is closer to the one or more LED chips than the second light-altering layer. In certain embodiments, the first light-altering layer comprises a first light-reflective layer and the second light-altering layer comprises a second light-reflective layer, wherein the first light-reflective layer has different reflectivity to peak wavelengths of light from the one or more LED chips than the second light-reflective layer. In certain embodiments, the first light-altering layer comprises a first light-diffusing layer and the second light-altering layer comprises a second light-diffusing layer, wherein the first light-diffusing layer diffuses the light from the one or more LED chips differently than the second light-diffusing layer. In certain embodiments, one of the first light-altering layer and the second light-altering layer comprises a light-reflecting layer and the other of the first light-altering layer and second light-altering layer comprises a light-diffusing layer.

In certain embodiments, one or more of the first light-altering layer and the second light-altering layer comprise air voids dispersed within a bulk material. In certain embodiments, one or more of the first light-altering layer and the second light-altering layer comprise oxide particles dispersed within a bulk material. In certain embodiments, the light-transparent layer forms an interior light mixing chamber that is bounded by the first light-altering layer and the second light-altering layer. In certain embodiments, the interior mixing chamber is one of a plurality of interior mixing chambers that are stacked within the support element.

In certain embodiments, the one or more LED chips comprise a first LED chip configured to provide a first peak wavelength in a range from 430 nanometers (nm) to 480 nm, a second LED chip configured to provide a second peak wavelength in a range from 500 nm to 570 nm, and a third LED chip configured to provide a third peak wavelength in a range from 600 nm to 700 nm. In certain embodiments, at least one of the first light-altering layer and the second light-altering layer comprises a multiple layer structure.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
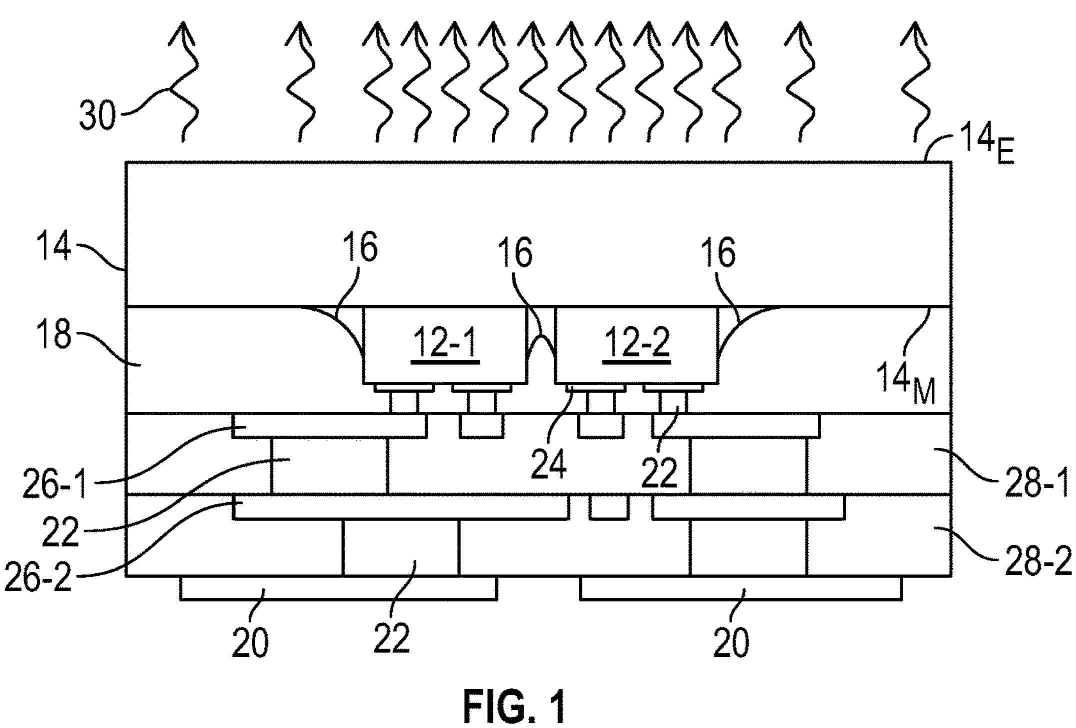
FIG. 1 is a cross-sectional view of a light-emitting diode (LED) device that includes multiple LED chips that are mounted to a mounting face of a support element.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Boundaries between various adjacent layers may be sharp, or more gradual, depending on intended surface finishes and manufacturing process details. Common elements between figures may be shown herein with common element numbers and may not be subsequently re-described.

The present disclosure relates to light-emitting devices including solid-state light-emitting devices, light-emitting diode (LED) devices, LED devices with LED chip arrays, and LED packages with support elements for improved near-field and far-field emissions. LED chips may be mounted to support elements in a manner that directs light through the support elements in desired emission directions. Support elements include optical structures that spread and mix light forward and laterally within the support element. Optical structures include interior mixing chambers bounded by light-altering layers, such as light-diffusing layers, light-reflective layers, specular light-diffusing elements, and/or diffuse-reflective elements that effectively increase internal reflections within the mixing chambers for lateral spreading and mixing of light, thereby increasing path lengths that light will propagate within devices before being released. Accordingly, effective device thicknesses related to path lengths of light may be increased without substantial increases to actual device thicknesses. Support elements as described may be well suited for low profile LED devices where device heights are less than or equal to device widths.

Before delving into specific details of various aspects of the present disclosure, an overview of various elements that may be included in exemplary LED devices of the present disclosure is provided for context. An LED chip typically comprises an active LED structure or region that can have many different semiconductor layers arranged in various ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), indium phosphide (InP), and related compounds.

The active LED structure may be grown on a growth substrate that can include many materials, such as sapphire, SiC, aluminum nitride (AlN), GaN, GaAs, glass, or silicon. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer and n-type and p-type layers. In certain embodiments, the active LED structure emits blue light with a peak wavelength range of approximately 430 nanometers (nm) to 480 nm, or green light with a peak wavelength range of 500 nm to 570 nm, or red light with a peak wavelength range of 600 nm to 700 nm. In certain embodiments, the active LED structure may be configured to emit light that is outside the visible spectrum, including one or more portions of the ultraviolet (UV) spectrum. The UV spectrum is typically divided into three wavelength range categories denotated with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications. In certain aspects, a single LED package may include multiple LED chips, one or more of which may be configured to provide a different peak wavelength from the other LED chips.

An LED chip can also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, spectral density, color rendering index, etc. In certain embodiments, aggregate emissions of LED chips, optionally in combination with one or more lumiphoric materials, may be arranged to provide cool white, neutral white, or warm white light, such as within a color temperature range of 2500 Kelvin (K) to 10,000 K. In certain embodiments, lumiphoric materials having cyan, green, amber, yellow, orange, and/or red peak wavelengths may be used. In some embodiments, the combination of the LED chip and the one or more lumiphors (e.g., phosphors) emits an overall white combination of light. The one or more phosphors may include yellow (e.g., YAG:Ce), green (e.g., LuAg:Ce), and red (e.g., $Ca_{i-x-y}Sr_x Eu_y AlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, embedded into an optical or support element, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips.

As used herein, a layer or region of a light-emitting device may be considered to be "transparent" when at least 50% or at least 80% of emitted radiation that impinges on the layer or region emerges through the layer or region. Moreover, as used herein, a layer or region of an LED is considered to be "reflective" or embody a "mirror" or a "reflector" when more than 50% or at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective) . In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength. In other embodiments, a "light-transmissive" material may be configured with lower values, such as transmitting at least 10%, or at least 25% of light having a desired wavelength, while still being useful for a particular application and suppressing other wavelengths, such as ambient light and/or sunlight. In still further embodiments, the term "light-transmissive" may be used for applications where any useful light, such as emitting wavelengths from an underlying LED, may pass through the material. The terms transparent, reflective, and light-transmissive may be defined relative to certain wavelength ranges, such as those emitted by an LED chip and/or converted by any lumiphoric materials. Specific values listed above are meant to describe average values or properties of an element or layer. It is understood that variations of these properties may be present within or across such elements or layers.

As used herein, the term "opaque" refers to materials, surfaces, particles, among others, that are either not transparent or are non-light transmitting over at least a portion of the visible light spectrum. In certain aspects, the term "opaque" may also apply to the entire visible light spectrum. The term "non-light transmitting" may be considered as transmitting less than 20%, or less than 10% of a received light, or certain wavelengths of received light. A material may further be opaque due to either light absorption or light reflection. Some materials may be opaque at certain wavelengths and transparent at others. As a non-limiting example, a red pigment may act as a color filter by absorbing light wavelengths below approximately 600 nm, where it is opaque, while transmitting light wavelengths above approximately 600 nm, where it is transparent. A layer may include a distribution of opaque materials in an amount such that the layer remains light-transmissive.

The present disclosure can be useful for LED chips having a variety of geometries, such as lateral geometries. A lateral geometry LED chip typically includes both anode and cathode electrical connections on the same side of the LED chip that is opposite a substrate, such as a growth substrate. In certain embodiments, a lateral geometry LED chip may be flip-chip mounted such that the anode and cathode connections are on a face of the active LED structure that is opposite the primary emission face of the LED chip. In this configuration, electrical traces or patterns may be provided on a mounting surface for providing electrical connections to the anode and cathode connections of the LED chip. In a flip-chip configuration, the active LED structure is configured between the substrate of the LED chip and the mounting surface. Accordingly, light emitted from the active LED structure may pass through the substrate in a desired emission direction.

As described herein, the principles of the present disclosure are applicable to various embodiments with a variety of LED chip sized, including larger area chips as well as miniature LED chips and micro-LED chips. As used herein, a large area LED chip may have lateral dimensions up to about 2000 microns (μm), while miniature LED chips may have lateral dimensions around 100 μm, and micro-LED chips may have lateral dimensions below 50 μm. In this manner, LED chips of the present disclosure may have lateral dimensions in a range from 20 μm to 2000 μm, or in a range from 20 μm to 1000 μm, or in a range from 20 μm to 100 μm, or in a range from 100 μm to 2000 μm, depending on the application.

According to aspects of the present disclosure, LED packages may include one or more elements, such as lumiphoric materials, encapsulants, light-altering materials, lenses, superstrates or support elements, adhesive elements, and electrical contacts, among others, that are provided with one or more LED chips. Light-altering materials may be arranged within LED packages to reflect or otherwise redirect light from the one or more LED chips in a desired emission direction or pattern. The term "superstrate" is used herein as a support element in an LED device, in part, to avoid confusion with other traditional substrates or submounts that may conventionally be part of LED devices, such as a growth or carrier substrate of the LED chip and/or a submount of an LED package. The term "superstrate" is not intended to limit the orientation, location, and/or composition of the structure it describes, nor various optical, electrical, thermal, and mechanical properties beyond the description of a support element as described herein. In certain embodiments, the superstrate may be composed of a transparent material, a semi-transparent material, or a light-transmissive material to various wavelengths of light provided by an LED chip and/or lumiphoric material.

As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), zirconium oxide ($ZrO_2$), aluminum oxide ($Al_2O_3$), metal particles, glass fibers and/or glass particles suspended in a binder, such as silicone or epoxy. In certain aspects, the particles may have an index or refraction that is configured to refract light emissions in a desired direction. In certain aspects, light-reflective particles may also be referred to as light-scattering particles. For light-absorbing materials, the light-altering material may include at least one of carbon, silicon, metal, metal oxides (e.g., iron oxides and the like) and organic particles suspended in a binder, such as silicone or epoxy. Exemplary organic particles may include various pigments, dyes, and/or absorptive additives. Thixotropic materials may include one or more of glass fillers and fumed silica. The light-reflective materials and the light-absorbing materials may comprise nanoparticles. In certain embodiments, the light-altering material may comprise a generally white color to reflect and redirect light. In other embodiments, the light-altering material may comprise a generally opaque color, such as black or gray, for absorbing light and increasing contrast. In certain embodiments, the light-altering material includes both light-reflective material and light-absorbing material suspended in a binder. As used herein, a layer or coating of one or more light-altering materials may be referred to as a light-altering coating. In certain embodiments, a light-altering material or coating may be devoid of lumiphoric materials. Light-altering elements may also refer to modified surfaces, such as textures used for diffusion and/or scattering, that do not necessarily require added particles. In still further embodiments, light-altering materials may be provided in the form of coatings that are applied to outer sides or surfaces of light-emitting devices to control light emission.

In certain applications, it is desirable to increase the speed of manufacturing LED devices. One approach to increasing speed of manufacture is to assemble many components on a single support element (or superstrate as described below) and later separate the groups into component arrays. This can be particularly useful when creating multi-color component arrays for use in high-definition (HD) video displays. Multiple arrays can be created as a large sheet and subsequently singulated into individual arrays comprising a plurality of LED devices for each singulated portion. In this manner, a single LED device, after singulation, may be populated with multiple LED chips of different emission colors, such as red, green, and blue, among other. In this regard, such LED devices may be well suited for use as pixels within HD video displays and/or signage applications. In other embodiments, larger arrays of LED chips may be formed together to provide LED components, LED tiles, LED screens, and/or LED displays.

Additionally, the elimination of various elements of a conventional LED device may streamline the manufacturing process, improve light quality, promote device miniaturization, and/or reduce costs. For example, LED devices can be assembled without the use of, or devoid of, a conventional LED package submount (e.g., a ceramic submount with traces, a lead frame structure, a printed circuit board, etc.). This may be accomplished by assembling the LEDs topside down, such that the LED is assembled on a support element, such as a transparent superstrate or a light-transmissive layer, which will become a topside outer surface in the finished product. The components can then be electrically connected through exposed electrical connection points on the opposite side of the LEDs. The device or apparatus may therefore be devoid of a traditional submount on the side of the LEDs opposite the light-transmitting side, such as, for example, a ceramic, metal, or other type of rigid material substrate upon which LEDs are often attached. An LED device built from the topside down as described herein can be considered a complete LED device, which is devoid of such a rigid submount. That is not to say that such LED devices cannot later be assembled into a larger (e.g., multiple component) device, which can, for example, include a traditional package submount.

While such single LED devices with closely-spaced LED chips of multiple colors may be well suited for use as pixels within HD video displays and/or signage applications, challenges exist in near-field and/or far-field emission patterns from such devices. For example, nonmatching far-field emission patterns provided by different LED chips (e.g., red, blue, and green LED chips) in a single package may contribute to the appearance of a color shift when viewing video displays at various angles. Emission variations can arise both from different emission patterns for the different color chips and from their geometrical placement within LED packages. In another example, near-field emissions are typically concentrated along a center of an LED device from closely-spaced LED chips, which contributes to a more pixelated appearance or reduced fill factor within video screens and displays. In this regard, when multiple LED devices with centrally concentrated near-field emission patterns are assembled together, a so-called "screen door" effect may be visible when darker lines are formed in columns and rows along boundaries of the LED devices within the display.

Support elements according to the present disclosure provide improved far-field emission patterns for increased uniformity at wider viewing angles within a display and/or improved near-field emission uniformity that increases the fill factor within each LED device, thereby reducing the screen door effect in the display. Support elements may include laminate structures with transparent superstrates and/or light-transmissive layers, and any number of materials and optical structures that exhibit light-transmissive and/or light-scattering properties relative to associated LEDs and/or lumiphoric materials. In certain embodiments, support elements may include a laminate structure of various layers or sublayers that are configured to improve near-field and/or far-field emission patterns, particularly for light-emitting devices with multiple chips that emit multiple peak wavelengths of light. The laminate films may generally be light-transmissive to light from corresponding LED chips while also exhibiting one or more of light-reflecting, light-refracting, light-absorbing, light-scattering, and/or light-diffusing properties. In particular embodiments, exemplary support elements may include a light-transparent layer that is sandwiched between two layers with increased light-reflecting, light-refracting, light-absorbing, light-scattering, and/or light-diffusing properties relative to the light-transparent layer. In this regard, the centrally located light-transparent layer may form a mixing chamber for light that may laterally propagate and internally reflect several times along the support element before ultimately escaping the LED device with improved emission uniformity. As used herein, an interior mixing chamber within a support element may also be referred to as an optical cavity.

FIG. 1 is a cross-sectional view of an LED device 10 that includes multiple LED chips 12-1 to 12-2 that are mounted to a mounting face $\mathbf{14}_M$ of a support element 14. For illustrative purposes, only two LED chips 12-1 to 12-2 are illustrated. However, the LED chips 12-1 to 12-2 may include any number of LED chips that are configured to emit the same or different wavelengths of light, depending on the embodiment. By way of example, for display applications where the LED device 10 forms a display pixel, three LED chip may be provided that are configured to emit blue light, green light, and red light. Other color combinations, inclusive of white emissions, may be provided depending on the application. Depending on the application, the LED chips 12-1 to 12-2 may comprise various lateral dimensions, such as in a range from 20 μm to 2000 μm, or in a range from 20 μm to 1000 μm, or in a range from 20 μm to 100 μm, or in a range from 100 μm to 2000 μm. Miniature LED chips (e.g., around 100 μm to 300 μm+/−50 μm) and micro-LED chips (e.g., below 100 μm) may be well suited for pixels in LED displays.

The LED chips 12-1 to 12-2 may be mounted to the support element 14 by way of a die-attach layer 16 that may be continuous or discontinuous across the mounting face $\mathbf{14}_M$ of the support element 14. The die-attach layer 16 may be light-transmissive to wavelengths of light generated by the LED chips 12-1 to 12-2, with exemplary materials including silicone and/or epoxy. After the LED chips 12-1 to 12-2 are adhered to the support element 14 by way of the die-attach layer 16, an encapsulant layer 18 may be applied around a perimeter of and optionally between the LED chips 12-1 to 12-2. The encapsulant layer 18 may be applied by one or more of dispensing, molding, stenciling, screen printing, spinning, spraying, powder-coating, or slit coating. The encapsulant layer 18 may comprise electrically insulating materials, such as one or more of epoxy, epoxy-polyester hybrid, aliphatic urethane, triglycidyl isocyanurate (TGIC) polyester, non-TGIC polyester, silicone, silicone-modified polyester, silicone hybrid, silicone-epoxy hybrid, acrylic, polycarbonate, or any suitable combinations thereof. In certain embodiments, the encapsulant layer 18 may comprise a light-altering material used to control the light output of the LED device 10. For example, the encapsulant layer 18 may comprise light-reflective and/or light-refractive materials to redirect light from the LED chips 12-1 to 12-2, or even light-absorbing materials that provide increased contrast. Certain light-reflective and/or light-refractive materials may exhibit a white appearance while light absorbing materials may exhibit a dark or even black appearance. In certain embodiments, the encapsulant layer 18 may contain structures designed to increase its mechanical strength or other fillers designed to control the coefficient of thermal expansion (CTE).

Electrical connections for the LED chips 12-1 to 12-2 may be provided on sides of the LED chips 12-1 to 12-2 that are opposite the support element 14. Stated differently, the LED chips 12-1 to 12-2 may be arranged between the support element 14 and electrical connections for the LED chips 12-1 to 12-2. In this manner, at least a portion of light from the LED chips 12-1 to 12-2 may pass through the support element 14 without interacting with the electrical connections. The electrical connections may include device contact pads 20 that are electrically connected to one or more of the LED chips 12-1 to 12-2 by way of electrically conductive paths 22 that may include, but are not limited to, electrically conductive pedestals, bump bonds, solder material, wires, traces, and vias comprising metals such as gold (Au) and/or copper (Cu). Different electrically conductive paths 22 may be coupled to corresponding ones of chip contact pads 24. The device contact pads 20 may include a single layer or multiple layers depending on the arrangement and/or manufacturing sequence. A number of electrically conductive traces 26-1, 26-2 and insulating layers 28-1, 28-2 may further be employed to route electrical connections between the device contact pads 20 and the chip contact pads 24. In certain embodiments, the electrically conductive traces 26-1, 26-2 may embody patterned metal traces. For example, the electrically conductive trace 26-1 may be patterned such that segments thereof are electrically coupled with the one or more of the LED chips 12-1 to 12-2 and further extend on portions of the encapsulant layer 18. In certain embodiments, the electrically conductive traces 26-1, 26-2, the insulating layers 28-1, 28-2, and the various electrically conductive paths 22 may from a fanout circuit structure. In still further embodiments, the electrically conductive traces 26-1, 26-2, the insulating layers 28-1, 28-2, and the various electrically conductive paths 22 may be formed at a wafer or panel level before the individual LED device 10 is singulated.

The arrangement of the LED chips 12-1 to 12-2 relative to the support element 14 is provided such that light 30 that escapes the LED device 10 from the LED chips 12-1 to 12-2 may pass through the support element 14 and out of a primary emission face $\mathbf{14}_E$ that is opposite the mounting face $14_M$. For illustrative purposes, the light 30 is illustrated as a number of arrows that propagate in a direction away from the primary emission face $14_E$. The illustrated arrows for the light 30 are not meant to be an exact representation of specific light directions as in a ray trace diagram, but rather a conceptual representation of the intensity at the primary emission face $14_E$. For arrangements where the support element 14 is substantially transparent to the light 30, the light 30 exiting the LED device 10 is more concentrated along central portions of the primary emission face $14_E$ that are registered with the LED chips 12-1 to 12-2. In this manner, the LED device 10 may exhibit reduced color shift and uniformity for far-field emission patterns as well as increased near-field bright spots that reduce a fill factor in LED displays.

Figure 2:
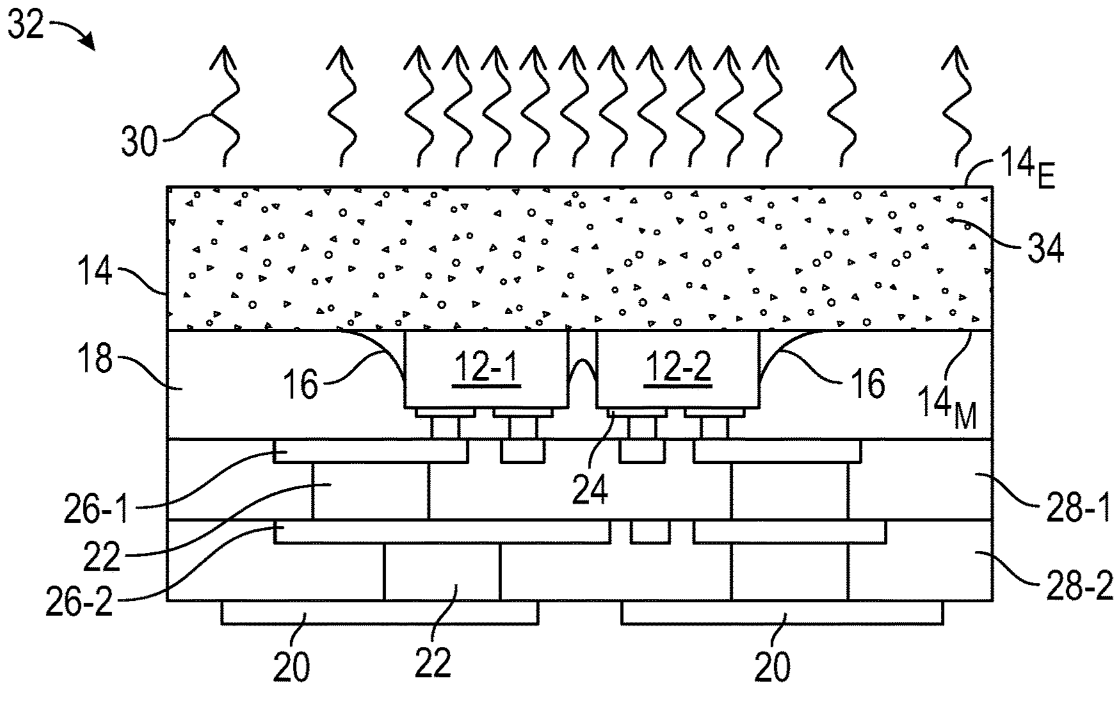
FIG. 2 is a cross-sectional view of an LED device that is similar to the LED device of FIG. 1 except the support element further includes diffuse materials therein.

FIG. 2 is a cross-sectional view of an LED device 32 that is similar to the LED device 10 of FIG. 1 except the support element 14 further includes diffuse materials 34 therein. In this manner, the support element 14 may diffuse and/or scatter light 30 from the LED chips 12-1 to 12-2. However, for certain applications, such as LED display applications, a thickness of the support element 14 is typically thin, small, or reduced to maintain an overall low profile for the LED device 32. In this regard, the presence of diffuse materials 34 alone throughout the support element 14 may not be enough to substantially impact the near-field and far-field emission patterns of the light 30 exiting the LED device 32. While it is common to add diffuse materials 34 over the LED chips 12-1 to 12-2, the desired effect on the light uniformity may be minimal as suggested by the lack of change in arrows for the light 30 between FIG. 2 and FIG. 1. In particular, the effect is minimal when the thickness of the diffuse materials 34 is thin.

Figure 3:
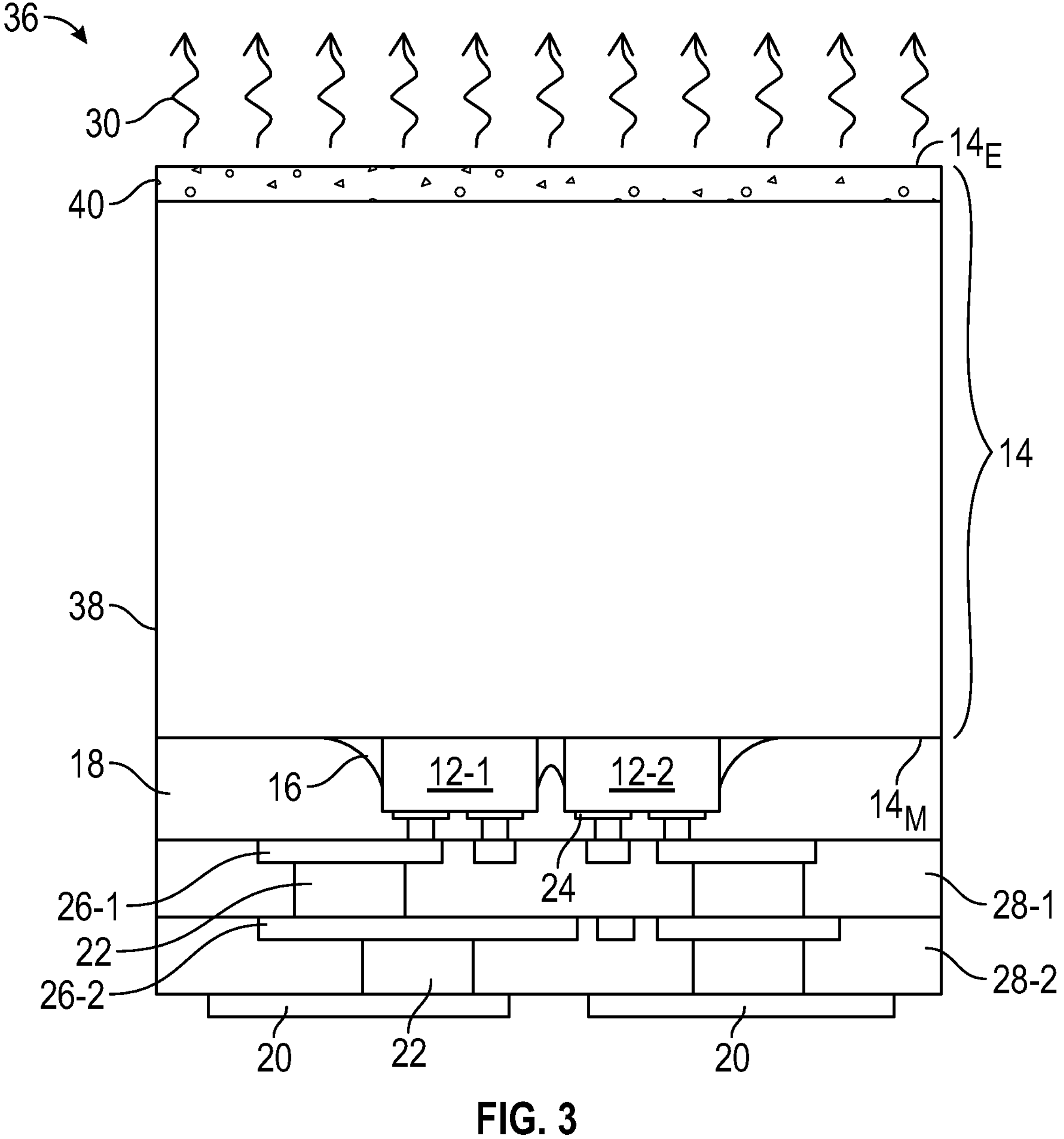
FIG. 3 is a cross-sectional view of an LED device that is similar to the LED device of FIG. 1 except the support element includes a light-transparent layer and a light-diffusing layer.

FIG. 3 is a cross-sectional view of an LED device 36 that is similar to the LED device 10 of FIG. 1 except the support element 14 includes a light-transparent layer 38 and a light-diffusing layer 40. In this manner, the support element 14 of the LED device 36 incorporates features of both the LED device 10 of FIG. 1 and the LED device 32 of FIG. 2. As illustrated, the light-transparent layer 38 may be provided with a thickness that is substantially larger than the light-diffusing layer 40 or, for that matter, any other element of the LED device 36 to ensure a suitable propagation length for mixing of light 30 from the LED chips 12-1 to 12-2. In this regard, the light-diffusing layer 40 is separated from the emission faces of the LED chips 12-1 to 12-2 by a larger distance such that light 30 from the LED chips 12-2 to 12-2 propagating at various emission angles through the light-transparent layer 38 may reach and pass through the light-diffusing layer 40 with increased uniformity. While such an arrangement may advantageously improve near-field and far-field emission patterns, the added thickness of the LED device 36 from the thick light-transparent layer 38 may not be suitable for certain low-profile applications, such as LED displays, or for certain manufacturing processes since singulation for devices with high aspect ratios can be challenging.

Figure 4:
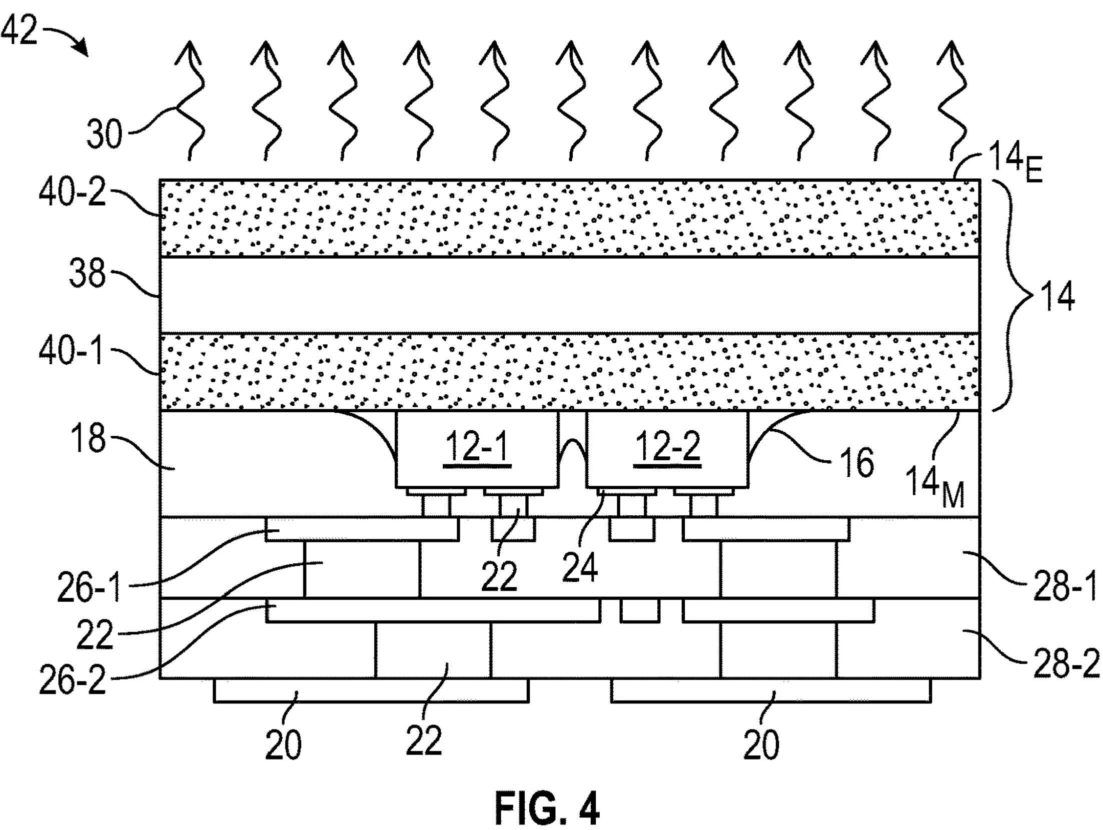
FIG. 4 is a cross-sectional view of an improved LED device relative to the LED device of FIG. 3 where the support element includes a multiple-layer structure that forms an interior mixing chamber for improving near-field and far-field emissions while also maintaining a low profile for the LED device.

FIG. 4 is a cross-sectional view of an improved LED device 42 relative to the LED device 36 of FIG. 3 where the support element 14 includes a multiple-layer structure that forms an interior mixing chamber for improving near-field and far-field emissions while also maintaining a low profile for the LED device 42. In certain embodiments, the support element 14 may include a first light-diffusing layer 40-1 and a second light-diffusing layer 40-2 that are on opposite sides of the light-transparent layer 38. During operation, emissions from the LED chips 12-1 to 12-2 may be initially scattered as they pass through the first light-diffusing layer 40-1 and into the light-transparent layer 38. The scattered emissions within the light-transparent layer 38 may be scattered a second time when interacting with the second light-diffusing layer 40-2. Such a structure provides scattering interfaces on opposing sides of the light-transparent layer 38 at interfaces with the light-diffusing layers 40-1, 40-2, and the light-transparent layer 38 may form an interior mixing chamber that is bounded by the scattering interfaces within the support element 14. In this manner, emissions within the light-transparent layer 38 may scatter multiple times at interfaces with the light-diffusing layers 40-1, 40-2 before exiting the LED device 42, thereby spreading more emissions laterally within the light-transparent layer 38. Accordingly, the light 30 exiting the LED device 42 may exhibit improved near-field and far-field emission patterns.

In certain embodiments, the light-transparent layer 38 may comprise glass, sapphire, or other hard materials that are light-transparent to wavelengths of light generated by the LED chips 12-1 to 12-2. The light-diffusing layers 40-1, 40-2 may comprise light-diffusing particles, such as particles of high refractive index, or different refractive index from surrounding media, or a visibly white pigment, that are dispersed within a light-transparent material. As used herein, light-diffusing particles may include any of the light-reflective and/or light-refractive particles described above with regard to the light-altering material. In certain embodiments, the light-transparent layer 38 and the light-diffusing layers 40-1, 40-2 may comprise a same material, such as glass, with the light-diffusing layers 40-1, 40-2 further comprising the light-diffusing particles that were added to the material to form the light-diffusing layers 40-1, 40-2. In other embodiments, the light-diffusing layers 40-1, 40-2 may comprise other materials, such as sol-gel, spin-on glass, and/or sintered glass frit with light-diffusing particles dispersed therein.

By forming the interior mixing chamber within the support element 14, improved emissions may be realized while also maintaining a low profile for the LED device 42. As used herein, a low profile may refer to relative dimensions where a height or thickness of the LED device 42 as measured from the device contact pads 20 to the primary emission face $14_E$ is less than or equal to a lateral width of the LED device 42 as measured from opposing peripheral edges of the support element 14. By way of example, the overall dimensions of the LED device 42 may include the height and width described above that is less than or equal to 1000 microns (μm), or less than or equal to 500 μm, or in a range from 200 μm to 1000 μm, or in a range from 200 μm to 500 μm. To achieve such dimensions, each the light-diffusing layers 40-1, 40-2 and the light-transparent layer 38 may each have a thickness in a range from 50 μm to 200 μm, or in a range from 25 μm to 200 μm, or in a range from 20 μm to 200 μm. In still further embodiments, the height and width described above may be in a range from 10 μm to 1000 μm, or in a range from 10 μm to 2000 μm.

Figure 5:
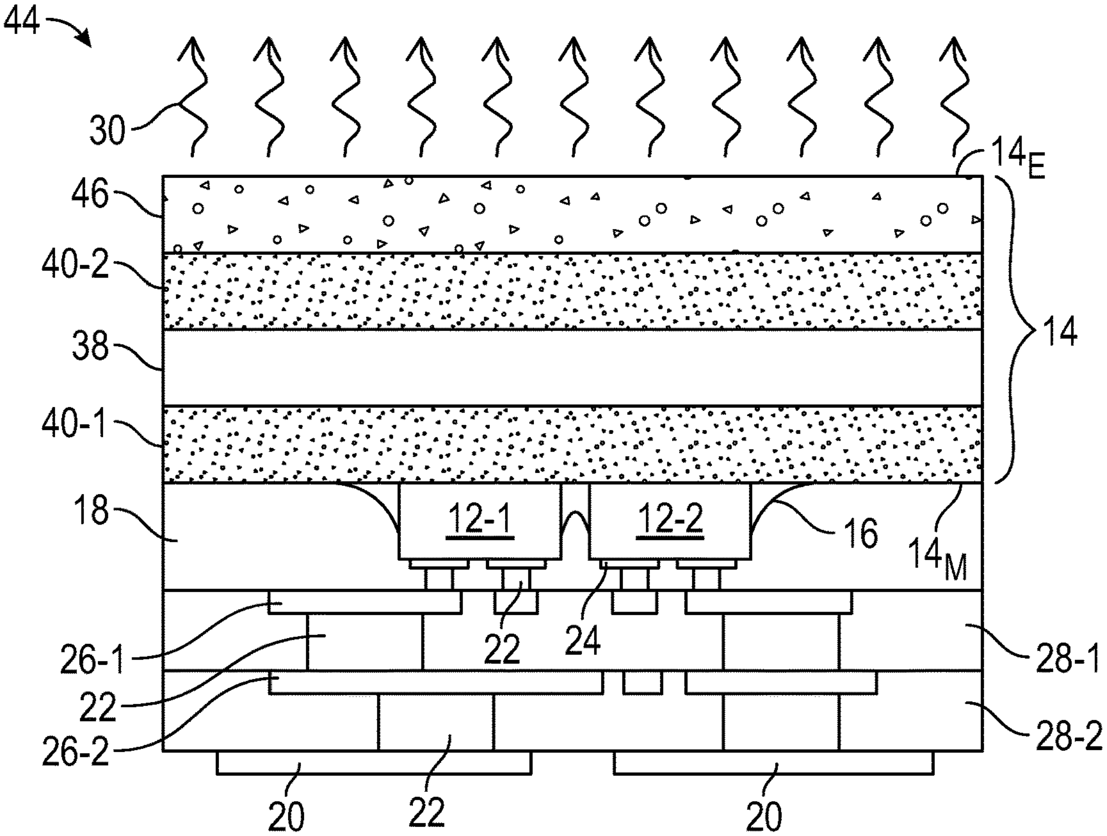
FIG. 5 is a cross-sectional view of an LED device that is similar to the LED device of FIG. 4 for embodiments where the support element further includes a light-absorbing layer.

FIG. 5 is a cross-sectional view of an LED device 44 that is similar to the LED device 42 of FIG. 4 for embodiments where the support element 14 further includes a light-absorbing layer 46. In certain embodiments, the light-absorbing layer 46 may be configured to be light-transmissive to a majority of the light 30 while also providing enough light-absorbing properties for increased contrast. For example, the light-absorbing layer 46 may be configured to reduce the appearance of the underlying white colors of the light-diffusing layers 40-1, 40-2 at wide viewing angles. In certain embodiments, the light-absorbing layer 46 may comprise a same base material as the light-diffusing layers 40-1, 40-2 with light-absorbing particles such as black particles instead of white particles. In still further embodiments, light-absorbing particles may be dispersed in the light-diffusing layer 40-2 and the separate light-absorbing layer 46 may be omitted.

Figure 6:
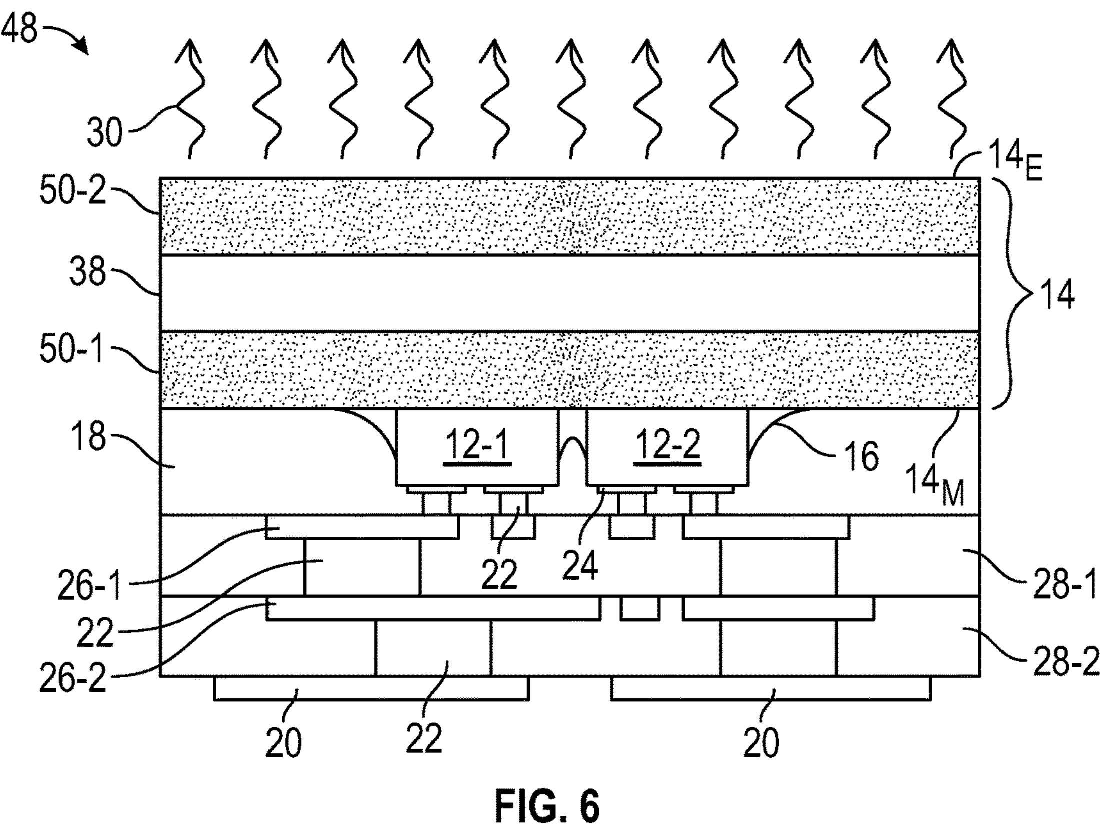
FIG. 6 is a cross-sectional view of an LED device that is similar to the LED device of FIG. 4 except the support element comprises first and second light-reflective layers on opposing sides of the light-transparent layer.

FIG. 6 is a cross-sectional view of an LED device 48 that is similar to the LED device 42 of FIG. 4 except the support element 14 comprises first and second light-reflective layers 50-1, 50-2 on opposing sides of the light-transparent layer 38. In this regard, the interior mixing chamber of the light-transparent layer 38 is bounded by reflective interfaces with the first and second light-reflective layers 50-1, 50-2. The first and second light-reflective layers 50-1, 50-2 may comprise thin layers or coatings of reflective material that are generally light-transmissive to emissions from the LED chips 12-1 to 12-2. In this regard, some light may pass through the first and second light-reflective layers 50-1, 50-2 while other portions of the light may be reflected. Accordingly, the first and second light-reflective layers 50-1, 50-2 may provide a similar function as the light-diffusing layers 40-1, 40-2 of FIG. 4. In certain embodiments, the first and second light-reflective layers 50-1, 50-2 may embody metal layers, each with a thickness that is less than or equal to 50 nm or in a range from 2 nm to 50 nm. In other embodiments, the thicknesses may be greater than 50 nm. In certain embodiments, the first and second light-reflective layers 50-1, 50-2 comprise thin layers of metal or dielectric reflectors that include single dielectric layers or multiple stacks of dielectric layers.

Figure 7:
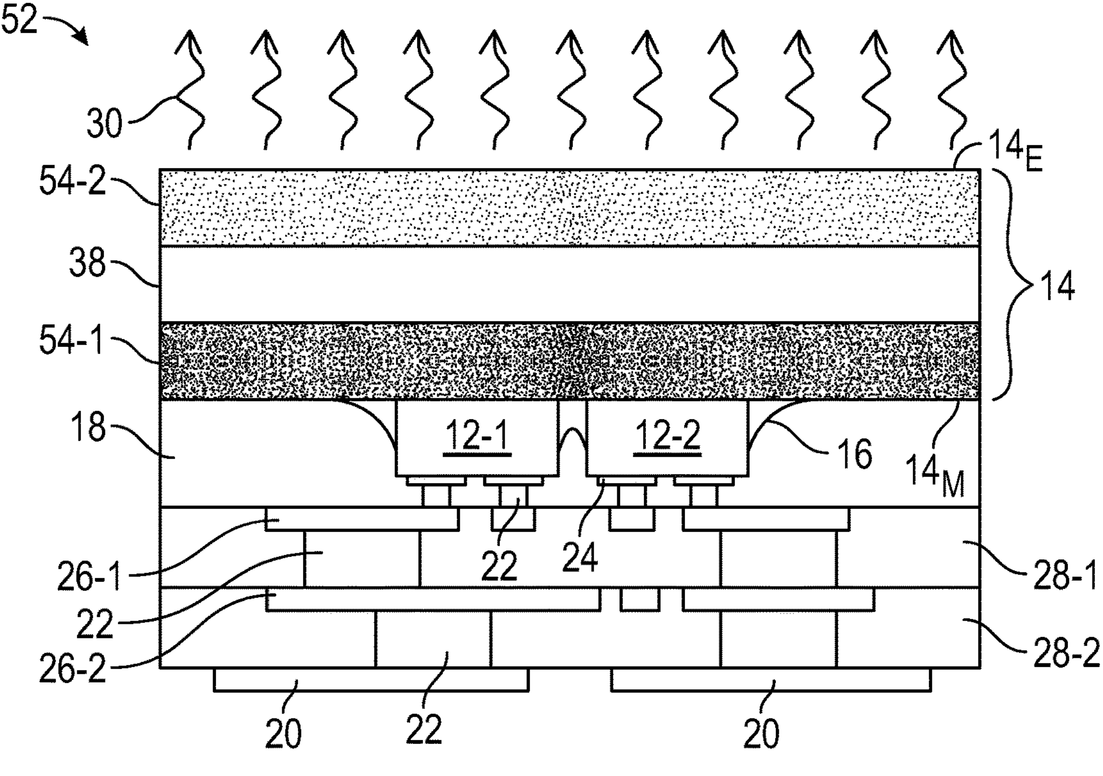
FIG. 7 is a cross-sectional view of an LED device that is similar to the LED device of FIG. 4 except the support element comprises the light-transparent layer between a first light-altering layer and a second light-altering layer that is different than the first light-altering layer.

FIG. 7 is a cross-sectional view of an LED device 52 that is similar to the LED device 42 of FIG. 4 except the support element 14 comprises the light-transparent layer 38 between a first light-altering layer 54-1 and a second light-altering layer 54-2 that is different than the first light-altering layer 54-1. For example, the second light-altering layer 54-2 may be configured to exhibit increased light transmissivity as compared to the first light-altering layer 54-1. In this manner, light 30 propagating and/or scattering within the light-transparent layer 38 may preferentially pass through the second light-altering layer 54-2 and out of the LED device 52 in a desired emission direction. Accordingly, reduced amounts of light 30 may pass back through the first light-altering layer 54-1 and toward the LED chips 12-1, 12-2, where such emissions may be susceptible to absorption. In other embodiments, the order may be reversed such that the first light-altering layer 54-1 is configured to exhibit increased light transmissivity as compared to the second light-altering layer 54-2 to promote increased light spreading and/or recycling within the light-transparent layer 38 before exiting the LED device 52.

In one embodiment for FIG. 7, the first light-altering layer 54-1 and the second light-altering layer 54-2 may both comprise light-reflective layers 50-1, 50-2 as described above for FIG. 6, except the first light-altering layer 54-1 may be configured to be more reflective to peak wavelengths of light from the LED chips 12-1 to 12-2 than the second light-altering layer 54-2. For example, the first light-altering layer 54-1 may comprise a different reflective material than the second light-altering layer 54-2. In another example, both the first and second light-altering layers 54-1, 54-2 comprise the same material, and the second light-altering layer 54-2 may be formed with a reduced thickness compared to the first light-altering layer 54-1 to provide the increased light transmissivity.

In another embodiment for FIG. 7, the first light-altering layer 54-1 and the second light-altering layer 54-2 may both comprise light-diffusing layers 40-1, 40-2 as described above for FIG. 4, except the first light-altering layer 54-1 may be configured to diffuse more light from the LED chips 12-1 to 12-2 than the second light-altering layer 54-2. For example, the first light-altering layer 54-1 may be loaded with a higher density of light-diffusing particles than the second light-altering layer 54-2, and/or the second light-altering layer 54-2 may be formed with a reduced thickness compared to the first light-altering layer 54-1 to provide the increased light transmissivity.

In yet another embodiment for FIG. 7, the first light-altering layer 54-1 may comprise the light-reflective layer 50-1 as described above for FIG. 6 and the second light-altering layer 54-2 may comprise the light-diffusing layer 40-2 as described above for FIG. 4. In this manner, the first light-altering layer 54-1 may embody a thin layer of reflective material that allows sufficient light to pass from the LED chips 12-1 to 12-2 to the light-transparent layer 38, while also restricting increased amounts of light within the light-transparent layer 38 from propagating back toward the LED chips 12-1 to 12-2. The second light-altering layer 54-2 may serve to further diffuse light as it exits the primary emission face $\mathbf{14}_E$ of the support element 14.

Figure 8:
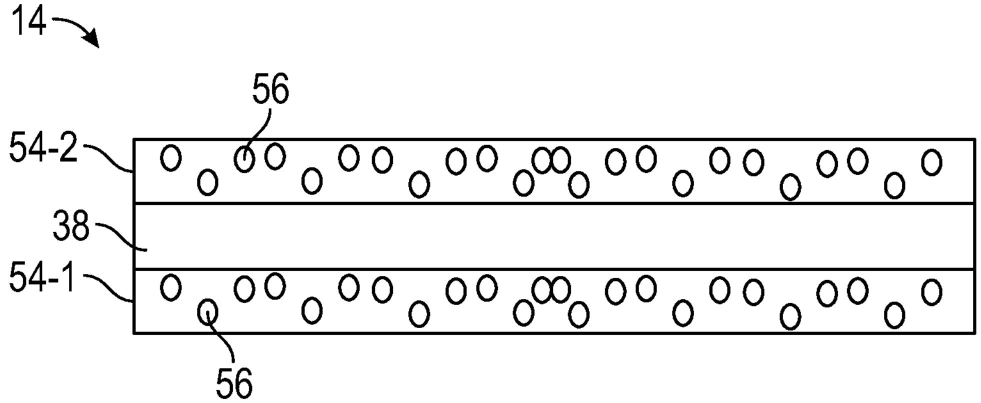
FIG. 8 is a cross-sectional view of an alternative configuration of the support element of FIG. 7 for embodiments where the first and second light-altering layers are loaded with air voids or air bubbles to promote increased light scattering.

FIG. 8 is a cross-sectional view of an alternative configuration of the support element 14 of FIG. 7 for embodiments where the first and second light-altering layers 54-1, 54-2 are loaded with air voids 56, or air pockets and/or air bubbles, to promote increased light scattering. In this regard, the bulk of the first and second light-altering layers 54-1, 54-2 may comprise light-transparent materials, such as glass or ceramic materials, and the air voids 56 may be dispersed therein to provide light-diffusing characteristics. In certain embodiments, each of the first and second light-altering layers 54-1, 54-2 and the light-transparent layer 38 may comprise a same material, such as ceramic materials, glass, spin on glass, or sintered glass frit. In other embodiments, one or more of the first and second light-altering layers 54-1, 54-2 and the light-transparent layer 38 may comprise different materials from one another. For example, the light-transparent layer 38 may comprise sapphire and the first and second light-altering layers 54-1, 54-2 may comprise another ceramic, such as aluminum oxide with some porosity. For glass frit embodiments, a laminate structure of the first and second light-altering layers 54-1, 54-2 and the light-transparent layer 38 may be sintered together, and a size and/or density of the air voids 56 may be controlled by selection of frit particle size and/or a pressure of the laminate structure.

Figure 9:
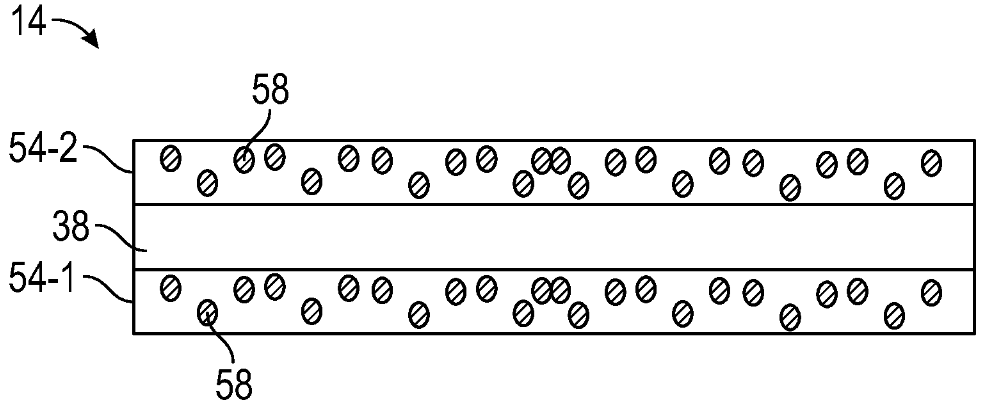
FIG. 9 is a cross-sectional view of an alternative configuration of the support element of FIG. 7 for embodiments where the first and second light-altering layers are loaded with oxide particles with shapes and/or particle size distributions or media with differing refractive index values to promote increased light scattering.

FIG. 9 is a cross-sectional view of an alternative configuration of the support element 14 of FIG. 7 for embodiments where the first and second light-altering layers 54-1, 54-2 are loaded with oxide particles 58 with shapes and/or particle size distributions or media with differing refractive index values to promote increased light scattering. In this regard, the bulk of the first and second light-altering layers 54-1, 54-2 may comprise light-transparent materials, such as glass or ceramic materials, and the oxide particles 58 may be dispersed therein to provide light-diffusing characteristics. As with the configuration of FIG. 8, each of the first and second light-altering layers 54-1, 54-2 and the light-transparent layer 38 may comprise a same material, such as ceramic materials, glass, spin on glass, or sintered glass frit. In other embodiments, one or more of the first and second light-altering layers 54-1, 54-2 and the light-transparent layer 38 may comprise different materials from one another. For example, the light-transparent layer 38 may comprise sapphire and the first and second light-altering layers 54-1, 54-2 may comprise another ceramic, such as aluminum oxide with the oxide particles 58. For glass frit embodiments, a laminate structure of the first and second light-altering layers 54-1, 54-2 and the light-transparent layer 38 may be sintered together. The size and/or density of the oxide particles 58 may be controlled by selection of frit particle size or distribution and/or controlling a sintering time such that some glass may precipitate out the oxide particles 58 within the first and second light-altering layers 54-1, 54-2. In another embodiment, a size and/or density of the oxide particles 58 may be controlled by the addition of oxide precursor materials that are loaded within the first and second light-altering layers 54-1, 54-2 before sintering. In still further embodiments, the oxide particles 58 as illustrated in FIG. 9 may represent any media that provides differing index of refraction values from the light-transparent layer 38 and the bulk of the first and second light-altering layers 54-1, 54-2.

In certain embodiments, the support element 14 as described above for any of FIGS. 4 to 9 may be formed by a laminate structure that is fired or sintered together. The laminate structure may include light-transparent materials, such as ceramics including aluminum oxide, sapphire, glass, spin on glass, or sintered glass frit in the light-transparent layers and/or light-altering layers described above. Light-diffusing particles, air voids, oxide particles, and reflective layers may be employed as the light-altering layers to define boundaries of interior light mixing chambers that circulate light therebetween. As such, light within the mixing chambers may spread laterally before exiting, thereby providing improved near-field and far-field emission patterns. In certain embodiments, such benefits may be realized for low profile dimensions where overall device heights are less than or equal to overall device widths. Any of the support elements 14 and related LED devices described above may advantageously be formed at a wafer level before individual device singulation. Additionally, any of the LED devices described above for FIGS. 4 to 9 may be well suited for providing improved near-field and far-field emissions when the LED devices include multiple LED chips of multiple colors. For example, a first LED chip may be configured to provide a first peak wavelength in a range from 430 nm to 480 nm, a second LED chip may be configured to provide a second peak wavelength in a range from 500 nm to 570 nm, and a third LED chip may be configured to provide a third peak wavelength in a range from 600 nm to 700 nm. Other embodiments may include one or more LED chips that provide UV wavelengths or wavelength ranges as described above.

Additionally, the support element 14 is generally illustrated above as a three-layer structure; however, it should be recognized that the support element 14 may include any number of layers while falling under the scope of the present disclosure. For example, individual ones of the light-diffusing layers 40-1, 40-2, the light-reflective layers 50-1, 50-2, and the light-altering layers 54-1, 54-2 may embody multiple-layered structures. The principles disclosed herein are related to increasing lateral spreading of light by recycling light through the support element 14 with increased reflection and/or diffusion (e.g., specular or diffuse reflection) from top and bottom areas or layers. These areas or layers could be anything from very thin (e.g., metal mirror) to something thicker. These areas or layers can be uniform within themselves as illustrated herein, have graded profiles, or be composed of multiple semi-uniform layers. In still further embodiments, the individual layers of the support elements 14 as described above for any of FIGS. 4 to 9 may be repeated to form multiple mixing chambers in a stacked fashion within a single support element 14.

It is contemplated that any of the foregoing aspects, and/or various separate aspects and features as described herein, may be combined for additional advantage. Any of the various embodiments as disclosed herein may be combined with one or more other disclosed embodiments in various sequences or repeated multiple times to increase their effects unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) device comprising:

one or more LED chips; and a support element on which the one or more LED chips are mounted, the support element comprising a mounting face on which the one or more LED chips are mounted and a primary emission face that is on an opposite side of the support element than the mounting face, wherein the support element is configured to be light-transmissive to wavelengths of light generated by the one or more LED chips, and the support element comprises an interior mixing chamber that spreads light laterally within the support element, wherein the interior mixing chamber is formed by a light-transparent layer that is positioned entirely between a first light-diffusing layer and a second light-diffusing layer, and the second light-diffusing layer comprises the primary emission face.

2. The LED device of claim 1, wherein the first light-diffusing layer forms the mounting face.

3. The LED device of claim 2, wherein at least one of the first light-diffusing layer and the second light-diffusing layer comprises a multiple layer structure.

4. The LED device of claim 2, wherein the light-transparent layer comprises glass, and the first light-diffusing layer and the second light-diffusing layer comprise glass with light-diffusing particles.

5. The LED device of claim 4, wherein the light-diffusing particles comprise particles with a different refractive index than the glass.

6. The LED device of claim 2, wherein the light-transparent layer, the first light-diffusing layer, and the second light-diffusing layer each have a thickness that is in a range from 20 microns (μm) to 200 μm.

7. The LED device of claim 2, wherein the support element further comprises a light-absorbing layer on the second light-diffusing layer.

8. The LED device of claim 7, wherein the light-absorbing layer comprises light-diffusing particles dispersed within a light-transparent material.

9. The LED device of claim 1, wherein the one or more LED chips are mounted to a mounting face of the support element, and an opposing face of the support element forms a primary emission face of the LED device.

10. The LED device of claim 9, further comprising contact pads on a side of the one or more LED chips that is opposite the support element, wherein a height of the LED device as measured from the contact pads to the primary emission face is less than or equal to a width of the support element as measured between opposing peripheral edges of the support element.

11. The LED device of claim 10, wherein the height and the width are in a range from 200 microns (μm) to 1000 μm.

12. The LED device of claim 1, wherein the interior mixing chamber is formed by a light-transparent layer that is between a first light-reflective layer and a second light-reflective layer.

13. The LED device of claim 12, wherein the first light-reflective layer and the second light-reflective layer each have a thickness that is less than or equal to 0.05 microns (μm).

14. The LED device of claim 1, wherein the one or more LED chips comprise a first LED chip configured to provide a first peak wavelength in a range from 430 nanometers (nm) to 480 nm, a second LED chip configured to provide a second peak wavelength in a range from 500 nm to 570 nm, and a third LED chip configured to provide a third peak wavelength in a range from 600 nm to 700 nm.

15. The LED device of claim 1, wherein the interior mixing chamber is one of a plurality of interior mixing chambers that are stacked within the support element.

16. A light-emitting diode (LED) device comprising:

one or more LED chips; and a support element on which the one or more LED chips are mounted, the support element comprising a mounting face on which the one or more LED chips are mounted and a primary emission face that is on an opposite side of the support element than the mounting face, wherein the support element is configured to be light-transmissive to wavelengths of light generated by the one or more LED chips, the support element comprising a light-transparent layer that is positioned entirely between a first light-altering layer and a second light-altering layer, and the second light-altering layer comprises the primary emission face.

17. The LED device of claim 16, wherein the first light-altering layer is closer to the one or more LED chips than the second light-altering layer.

18. The LED device of claim 17, wherein the first light-altering layer comprises a first light-reflective layer and the second light-altering layer comprises a second light-reflective layer, wherein the first light-reflective layer has different reflectivity to peak wavelengths of light from the one or more LED chips than the second light-reflective layer.

19. The LED device of claim 17, wherein the first light-altering layer comprises a first light-diffusing layer and the second light-altering layer comprises a second light-diffusing layer, wherein the first light-diffusing layer diffuses the light from the one or more LED chips differently than the second light-diffusing layer.

20. The LED device of claim 17, wherein one of the first light-altering layer and the second light-altering layer comprises a light-reflecting layer and the other of the first light-altering layer and second light-altering layer comprises a light-diffusing layer.

21. The LED device of claim 16, wherein one or more of the first light-altering layer and the second light-altering layer comprise air voids dispersed within a bulk material.

22. The LED device of claim 16, wherein one or more of the first light-altering layer and the second light-altering layer comprise oxide particles dispersed within a bulk material.

23. The LED device of claim 16, wherein the light-transparent layer forms an interior light mixing chamber that is bounded by the first light-altering layer and the second light-altering layer.

24. The LED device of claim 23, wherein the interior mixing chamber is one of a plurality of interior mixing chambers that are stacked within the support element.

25. The LED device of claim 16, wherein the one or more LED chips comprise a first LED chip configured to provide a first peak wavelength in a range from 430 nanometers (nm) to 480 nm, a second LED chip configured to provide a second peak wavelength in a range from 500 nm to 570 nm, and a third LED chip configured to provide a third peak wavelength in a range from 600 nm to 700 nm.

26. The LED device of claim 16, wherein at least one of the first light-altering layer and the second light-altering layer comprises a multiple layer structure.

* * * * *